United States Patent
Perna et al.

(10) Patent No.: US 11,903,143 B2
(45) Date of Patent: Feb. 13, 2024

(54) SOLDERING PRINTED CIRCUITS USING RADIANT HEAT

(71) Applicant: Microsoft Technology Licensing, LLC, Redmond, WA (US)

(72) Inventors: David Christopher Perna, Sunnyvale, CA (US); Elisa Naseem Haqq, Wilsonville, OR (US); Daniel Tusteh Chian, Los Altos, CA (US); Kevin The-Hung Pham, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 45 days.

(21) Appl. No.: 17/645,247

(22) Filed: Dec. 20, 2021

(65) Prior Publication Data

US 2023/0199971 A1    Jun. 22, 2023

(51) Int. Cl.
| | | |
|---|---|---|
| *H05K 1/02* | (2006.01) | |
| *H05K 1/11* | (2006.01) | |
| *H05K 1/14* | (2006.01) | |
| *H05K 3/36* | (2006.01) | |

(52) U.S. Cl.
CPC .......... *H05K 3/363* (2013.01); *H05K 1/0277* (2013.01); *H05K 1/111* (2013.01); *H05K 1/115* (2013.01); *H05K 1/144* (2013.01); *H05K 2201/09609* (2013.01); *H05K 2203/043* (2013.01)

(58) Field of Classification Search
None
See application file for complete search history.

(56) References Cited

U.S. PATENT DOCUMENTS

| | | | |
|---|---|---|---|
| 3,374,531 A | | 3/1968 | Vernon |
| 4,666,078 A | * | 5/1987 | Ohno .............. H05K 3/363 228/124.1 |
| 8,851,356 B1 | | 10/2014 | Holec et al. |
| 2004/0156583 A1 | * | 8/2004 | Totani .............. H05K 3/361 385/24 |
| 2009/0025972 A1 | | 1/2009 | Nishida et al. |
| 2013/0199824 A1 | * | 8/2013 | Lee .............. H05K 1/0298 174/250 |
| 2020/0280117 A1 | * | 9/2020 | Yosui .............. H01P 3/088 |

FOREIGN PATENT DOCUMENTS

WO    2021097383 A1    5/2021

OTHER PUBLICATIONS

"International Search Report and Written Opinion Issued in PCT Application No. PCT/US22/046208", dated Feb. 1, 2023, 13 Pages.

* cited by examiner

*Primary Examiner* — Hoa C Nguyen
*Assistant Examiner* — John B Freal
(74) *Attorney, Agent, or Firm* — Alleman Hall Creasman & Tuttle LLP

(57) ABSTRACT

Examples are disclosed related to forming solder joints between printed circuits by using radiant heat. One example provides a method of manufacturing an electronic device, the method comprising aligning a contact of a first printed circuit with a via of a second printed circuit. The method further comprises applying radiant heat via an infrared light source to a second surface of the second printed circuit, the radiant heat incident on the via to cause the via to conduct heat to solder located at an interface of the contact and the via, and after heating the solder to reflow, cooling the solder, thereby forming a solder joint between the contact of the first printed circuit and the via of the second printed circuit.

12 Claims, 10 Drawing Sheets

SOLDERING PRINTED CIRCUITS USING RADIANT HEAT

BACKGROUND

In many aspects of product design, it may be helpful to isolate different subsystems of a product for reasons such as manufacturability, testability, repairability, assembly, and/or yield. For example, cameras, sensors, displays, battery, user inputs, user outputs, and/or other subsystems may be designed as separate components from a main logic board.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to soldering printed circuits together using radiant heat. One example provides an electronic device comprising a first flexible printed circuit comprising a two-dimensional pattern of contacts on a first surface, and a second flexible printed circuit comprising a corresponding two-dimensional pattern of vias. The electronic device further comprises a plurality of solder joints, each solder joint formed between a via of the two-dimensional pattern of vias and a corresponding contact of the two-dimensional pattern of contacts.

Another example provides a method of manufacturing an electronic device, the method comprising aligning a contact of a first printed circuit with a via of a second printed circuit, the second printed circuit comprising a first surface facing the first printed circuit and a second surface facing away from the first printed circuit. The method further comprises applying radiant heat via an infrared light source to the second surface of the second printed circuit. The radiant heat incident on the via causes the via to conduct heat to solder located at an interface of the contact and the via, heating the solder to reflow. The method further comprises cooling the solder, thereby forming a solder joint between the contact of the first printed circuit and the via of the second printed circuit.

DETAILED DESCRIPTION

Figure 1:
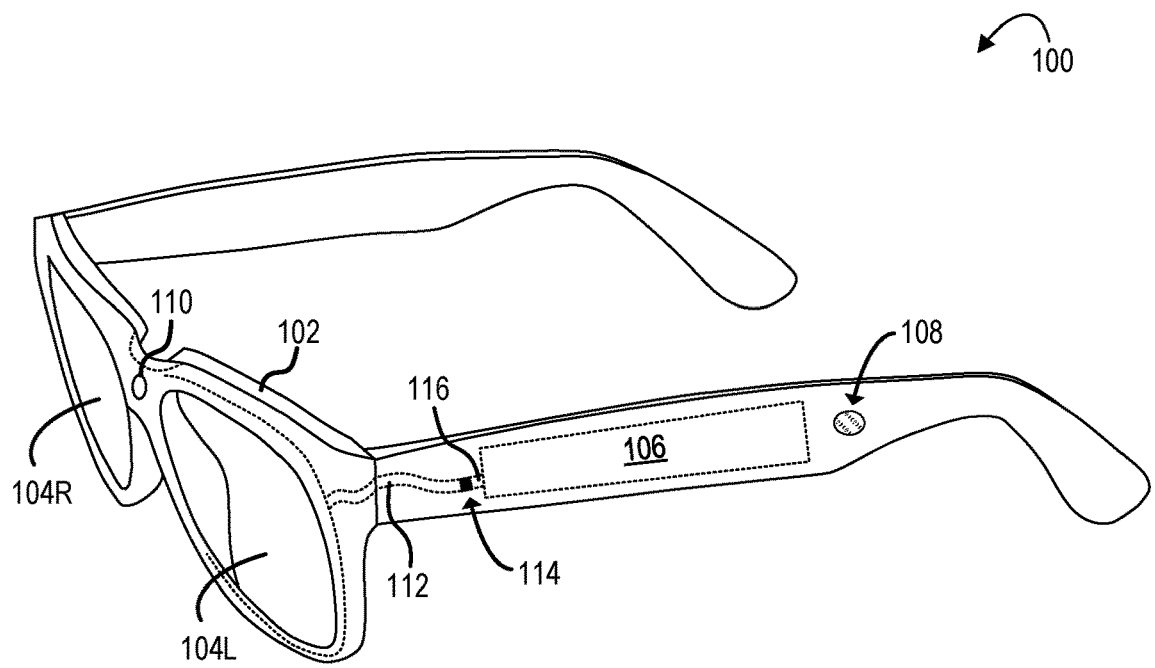
FIG. 1 shows an example electronic device in the form of a head-mounted display device.

As mentioned above, subsystems of an electronic device may be manufactured separately and connected during device assembly by joining printed circuits for the subsystems together. Various approaches may be used for forming electrical connections between printed circuits. For example, a mechanical connector on one printed circuit can be connected to a complementary mechanical connector on another printed circuit. However, such connectors are often relatively thick, e.g., 1-2 mm, and may pose challenges for product design due to volumetric constraints. Further, connectors may add weight and cost to a device. Thus, such connectors may be unsuitable for relatively lightweight, smaller form-factor devices.

In view of such issues with connectors, connector-less solutions are sometimes used for joining printed circuits. Examples of connector-less solutions include hot-bar soldering and anisotropic conductive film (ACF) bonding. Both hot-bar soldering and ACF bonding involve the use of a heated thermode that conducts heat to the joint via direct physical contact. Hot-bar soldering device utilizes a heating element that is pressed against a conductor, which conducts heat to a solder joint. To prevent shorting due to solder flow, larger contact pads are typically used, resulting in a relatively larger pitch (spacing between lines/pads of the electrical connection). While multiple solder joints can be formed simultaneously, the solder joints formed by a single process cycle may be arranged in a single row. Also, the heating element applies pressure, which can cause the printed circuits to move relative to each other or warp, potentially spoiling alignment.

ACF bonding uses a resin comprising conductive particles that can bridge between contacts when cured under pressure. ACF bonding may offer lower contact resistance than connectors, and occupy less space. However, ACF bonding may not hold up well under thermal stress, mechanical shock, and/or thermal cycling. Stiffeners can be added to the ACF joint after bonding to add strength and/or stiffness, but stiffeners may further increase the thickness, and add weight and expense. Mechanical features of the electronic device can be engineered to relieve some strain, but this may impose additional design constraints on the product, and may not be feasible for some devices.

Accordingly, examples are disclosed that relate to using non-contact radiant heat from an external source to form solder joints between printed circuits. For example, a conductive contact of a first printed circuit can be aligned in close proximity with a conductive via of a second printed circuit, with a volume of solder between the two conductors. Then, radiant heat from a light source is applied to the via. The via conducts heat to solder located at the interface with the contact to reflow the solder and form a solder joint connecting the first and second printed circuits. As described in more detail below, solder joints can be made between rigid printed circuits, between flexible printed circuits, or between a flexible printed circuit and a rigid printed circuit. The solder joint may provide advantages in size, conductivity, reliability, and cost compared to other methods of joining printed circuits, such as those described above. By avoiding use of a relatively bulky connector, size and costs may be reduced, which may allow for smaller, lower weight electronic devices. Additionally, solder joints may help to reduce contact resistance compared to the pin contacts of connectors. Such solder joints may also provide higher conductivity compared to ACF interconnects. Further, the direct solder joint may be mechanically stronger compared to connectors, which rely upon friction. This may provide increased reliability for the disclosed example solder joints compared to the use of mechanical connectors.

The disclosed examples further may alleviate various constraints on product design. For example, the disclosed examples allow for a two-dimensional pattern of solder joints to be formed in parallel between two flexible printed circuits. In contrast, hot-bar soldering may provide for a single row of solder joints per solder process. Additionally, hot-bar soldering may be limited to flex-to-rigid printed circuit connections due to the pressure applied by the soldering apparatus, and may be challenging to use in flex-to-flex connections. Furthermore, hot-bar soldering and ACF bonding may pose a higher limit on contact pitch, whereas the disclosed examples may allow the use of a relatively smaller pitch that enables a relatively higher density of solder joints at the connection interface.

FIG. 1 shows an example electronic device 100 that may comprise printed circuits soldered according to the disclosed examples. Electronic device 100 is a head-mounted display (HMD) device comprising a frame 102 and a display subsystem that outputs imagery to near-eye displays 104L, 104R. Near-eye displays 104L, 104R may be at least partially transparent to allow a user to view real-world objects. For example, each near-eye display 104L, 104R may comprise a transparent optical combiner (e.g., a waveguide) that delivers projected imagery to the user while allowing the user to view a real-world background through the combiner, thus enabling augmented reality applications, for example. Electronic device 100 further comprises a controller 106, one or more speakers 108, a microphone, and one or more cameras 110 and may comprise additional subsystems not shown in FIG. 1 (e.g., communication sub system).

Electronic device 100 further comprises flexible printed circuits connecting the various subsystems to controller 106 within a chassis of electronic device 100. For example, the display subsystem includes a flexible printed circuit 112 for carrying signal data from controller 106 to near-eye displays 104L, 104R. During manufacture of electronic device 100, an electrical connection may be formed at 114 to connect flexible printed circuit 112 to a flexible printed circuit 116 attached to controller 106. The use of a soldered connection between flexible printed circuit 112 and flexible printed circuit 116 formed by radiant heating as disclosed may occupy less space than the use of connectors to connect flexible printed circuits 112 and 116, and may be more robust than an ACF bond.

Figure 2:
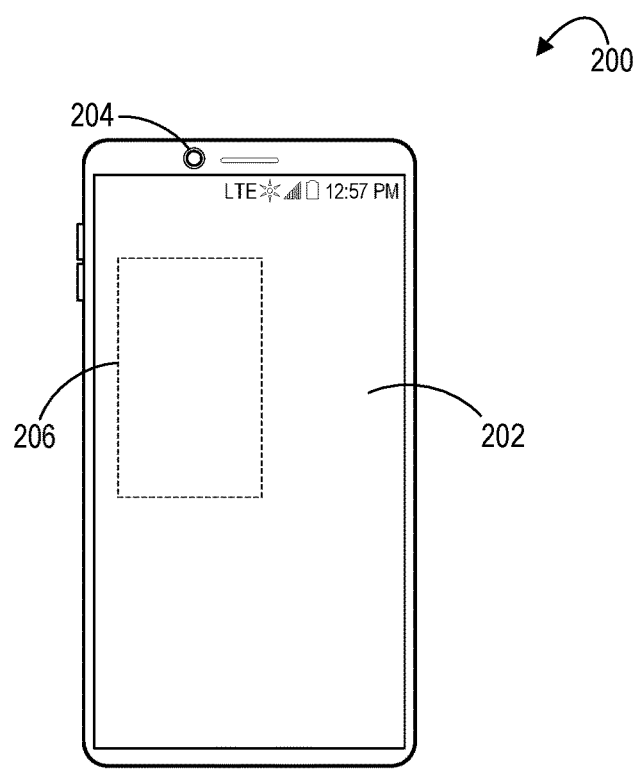
FIG. 2 shows another example electronic device in the form of a smart phone.

FIG. 2 shows another example electronic device 200 in the form of a smartphone. Electronic device 200 comprises various subsystems including a display 202 and a camera 204, and additional subsystems not shown (e.g., memory, mass storage, touch sensor, additional camera). Each subsystem may comprise a printed circuit (e.g., a flexible printed circuit) for connecting to a controller 206 of electronic device 200. Thus, the printed circuits of such subsystems may be connected with a printed circuit for the controller via solder connections as disclosed. The examples disclosed herein may provide relatively strong, lightweight, low-volumetric space connections between printed circuits.

Figure 3:
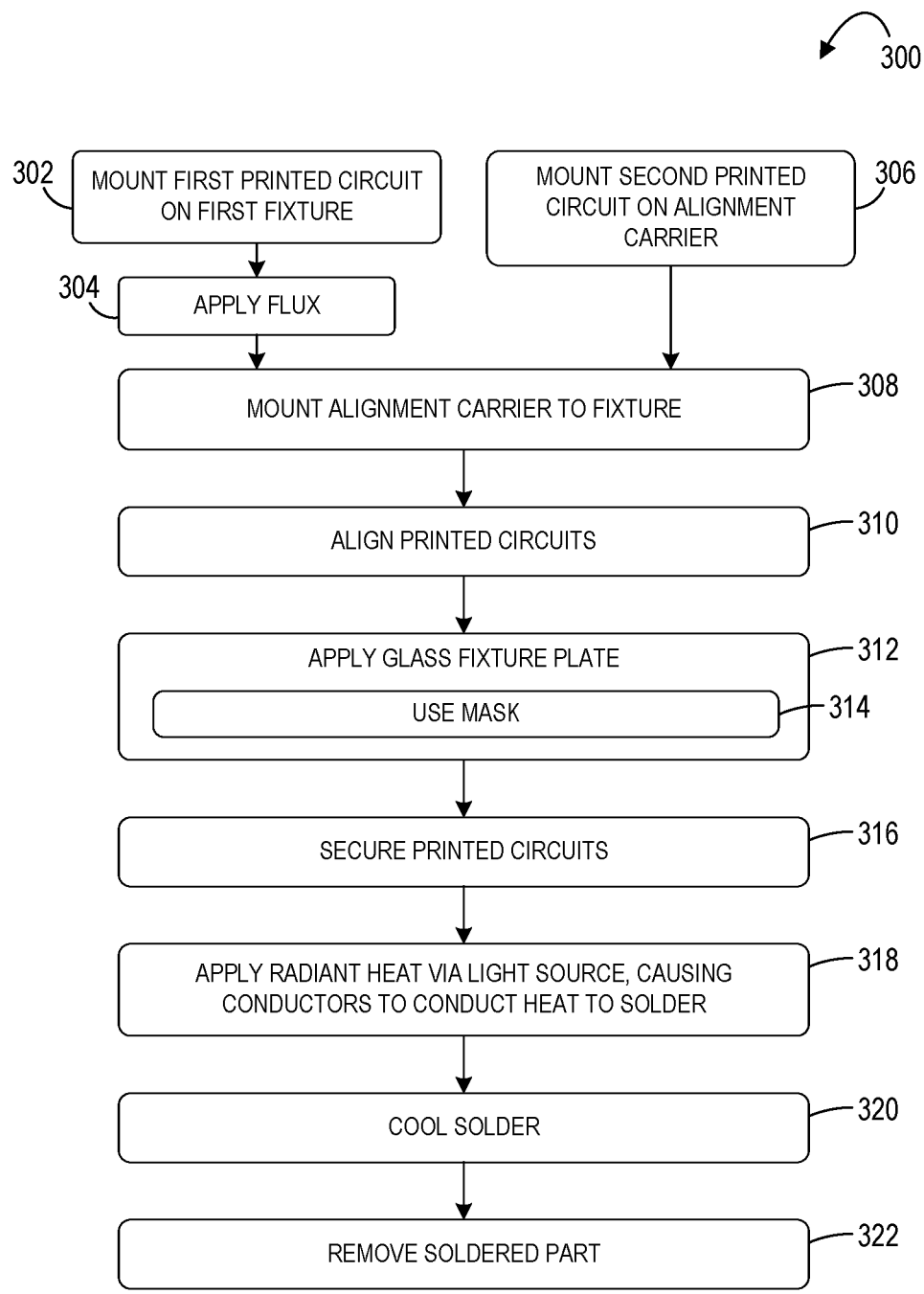
FIG. 3 shows a flow diagram illustrating an example method for forming solder joints between two printed circuits using radiant heat.

FIG. 3 shows a flow diagram depicting an example method 300 for manufacturing an electronic device. Method 300 is described with reference to FIGS. 4A-4J, which are cross-sectional views that illustrate two printed circuits throughout various stages of being joined by method 300. It will be understood that in other examples, various steps in method 300 may be performed in a different order than shown. Further, one or more steps may be omitted in some examples. Additionally, some examples may comprise additional steps not shown in FIG. 3.

Figure 4A:
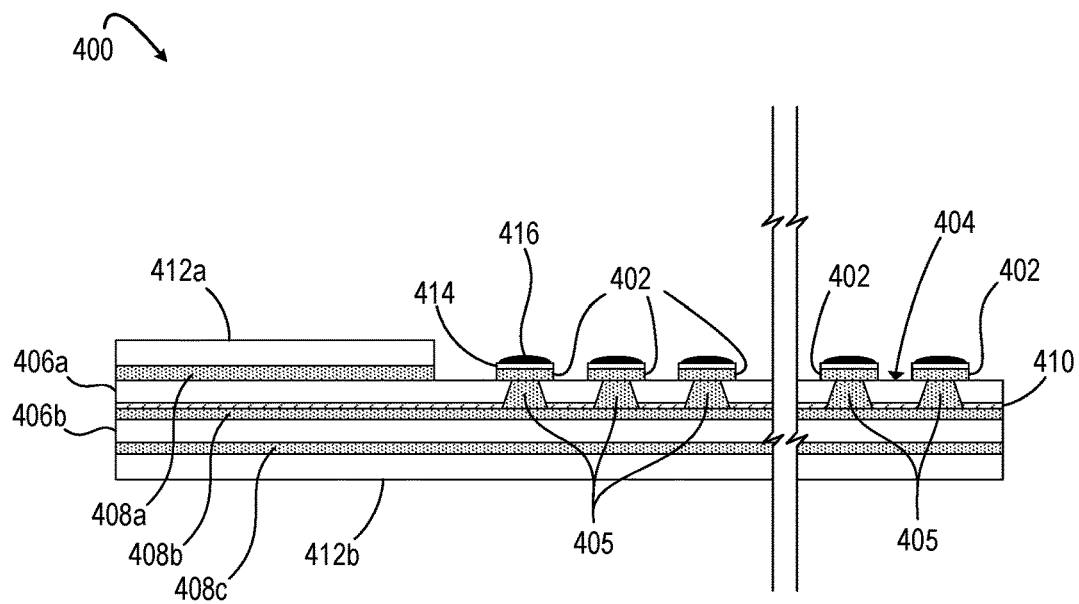
FIGS. 4A-4J schematically illustrate an example implementation of the method of FIG. 3 being used to join two printed circuits.

First printed circuit 400 (FIG. 4A) and second printed circuit 420 (FIG. 4B) each may be rigid or flexible. In the example of FIG. 4A, first printed circuit 400 comprises a plurality of contacts 402, also referred to as pads, five of which are shown. However, a printed circuit may comprise any other suitable number of contacts, including a single contact. As described in more detail below, the plurality of contacts 402 may be arranged in a two-dimensional pattern. Contacts 402 are exposed on a first surface 404 of first printed circuit 400. Contacts 402 may comprise any suitable conductive material. Examples include copper, aluminum, silver, and gold. In the example depicted in FIG. 4A, each contact comprises a via, where the conductive material of each contact 402 is electrically connected to a conductive via 405. In other examples, contacts 402 may not connect to any via, but instead be electrically connected to other printed conductors (e.g., traces) and/or pads on the printed circuit.

First printed circuit 400 further comprises two layers of dielectric material 406a, 406b (e.g., polyimide or polytetrafluoroethylene) with layers of circuitry 408a-c (e.g., one or more copper traces) located between layers and/or disposed on a surface of printed circuit 400. In other examples, the printed circuit may have any other suitable number of dielectric layers. First printed circuit further comprises an adhesive layer 410, and coverlays 412a, 412b. First printed circuit may comprise additional layers such as a copper backing layer (not shown) and/or additional adhesive layers (not shown).

First printed circuit 400 further comprises optional plating caps 414 disposed on contacts 402. Plating caps 414 may comprise any suitable conductive material. Examples include copper, gold, nickel, palladium, silver, tin. Further, solder bumps 416 are disposed on plating caps 414. In examples where plating caps 414 are omitted, solder bumps 416 may be disposed directly on top of contacts 402.

Figure 4B:
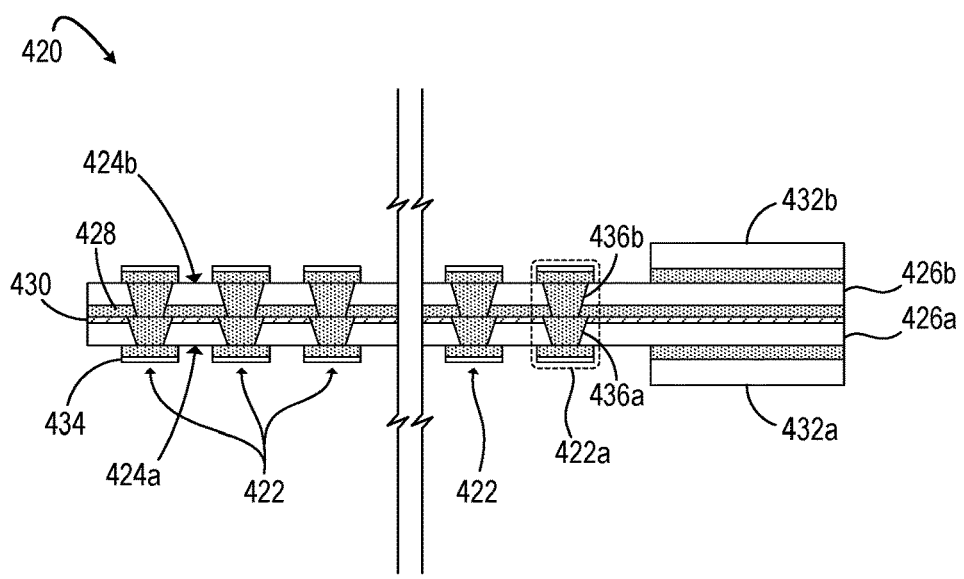

FIG. 4B shows a sectional view of a second printed circuit 420. Second printed circuit 420 comprises a plurality of vias 422 corresponding to contacts 402 of first printed circuit 400, wherein the term "corresponding to" indicates that the contacts are configured to be spatially aligned. As such, vias 422 may be arranged in a two-dimensional pattern corresponding to a two-dimensional pattern of contacts 402. In other examples, vias and contacts may have a linear arrangement on each printed circuit. Vias 422 are exposed on both a first surface 424a and a second surface 424b of second printed circuit 420. First surface 424a is configured to face first printed circuit 400 while second surface 424b is configured to face away from first printed circuit 400 when first printed circuit 400 and second printed circuit 420 are soldered together. Second printed circuit 420 further comprises layers of dielectric material 426a, 426b, circuitry 428, a bonding layer 430, and coverlays 432a, 432b. Plating caps 434 may optionally be disposed on vias 422. Vias 422 may comprise any suitable conductive material, e.g., copper, aluminum, silver, and gold.

In the example shown, vias 422 are constructed of blind vias. For example, via 422a comprises a blind via 436a between first surface 424a and layer of circuitry 428. Via 422a also comprises a blind via 436b between second surface 424b and layer of circuitry 428. In other examples, a printed circuit may have any other suitable configuration of vias. It will be understood that the structures of first printed circuit 400 and second printed circuit 420 are shown as illustrative examples. In other examples, any other suitable printed circuit structure may be employed.

Figure 4C:
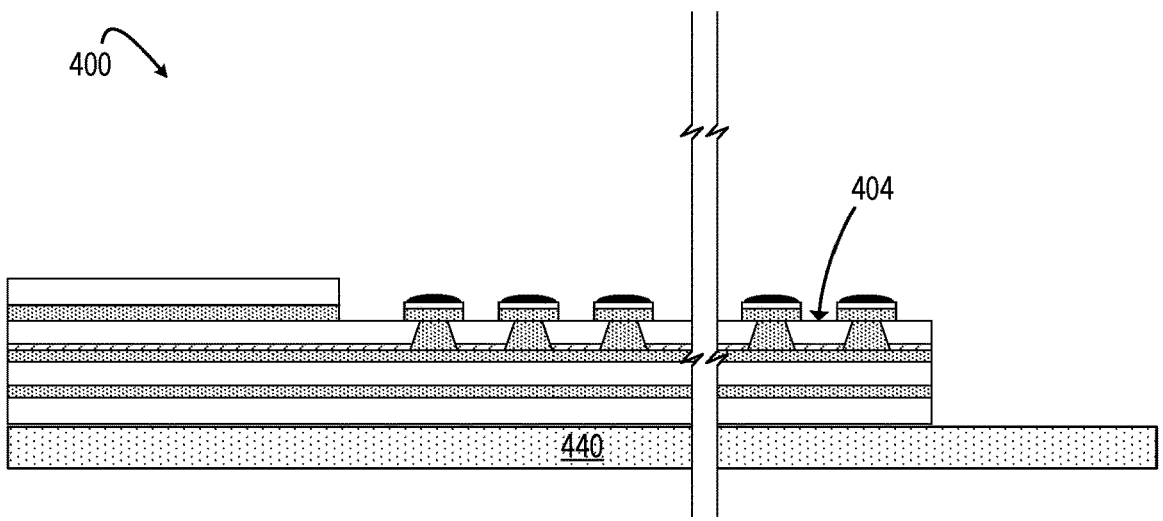
Figure 4D:
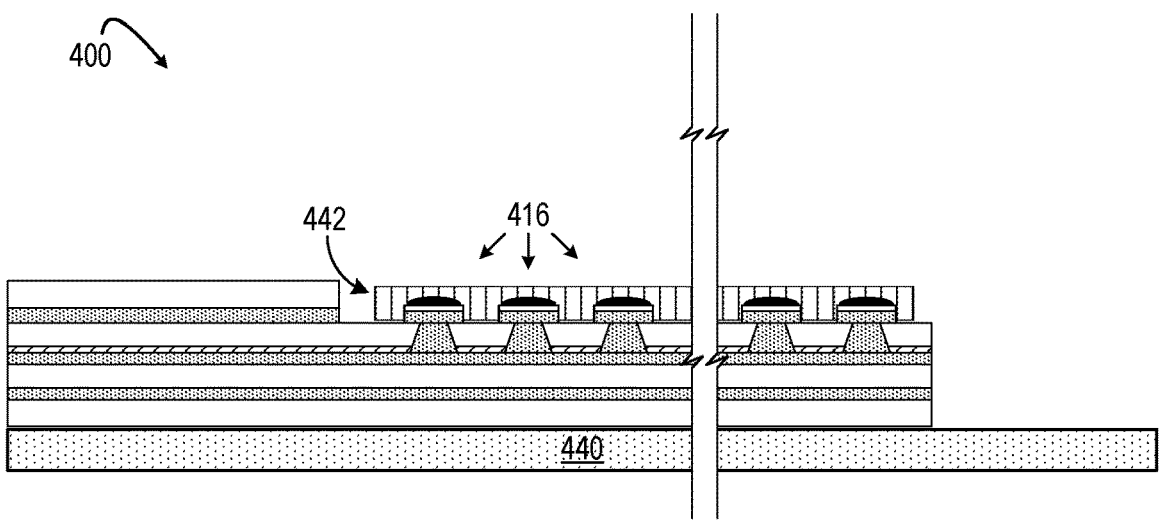

Returning to FIG. 3, at 302, method 300 comprises mounting first printed circuit 400 onto a fixture 440, as depicted in FIG. 4C. First printed circuit 400 is positioned such that first surface 404 is facing away from fixture 440. Fixture 440 may be configured to hold first printed circuit securely during the various processes outlined in method 300. At 304, method 300 optionally comprises applying flux 442 to solder bumps 416 and contacts 402 of first printed circuit 400, as shown in FIG. 4D. In other examples, flux may be applied to the printed circuit prior to loading the printed circuit onto the fixture carrier. In further examples, flux 442 may be omitted.

Figure 4E:
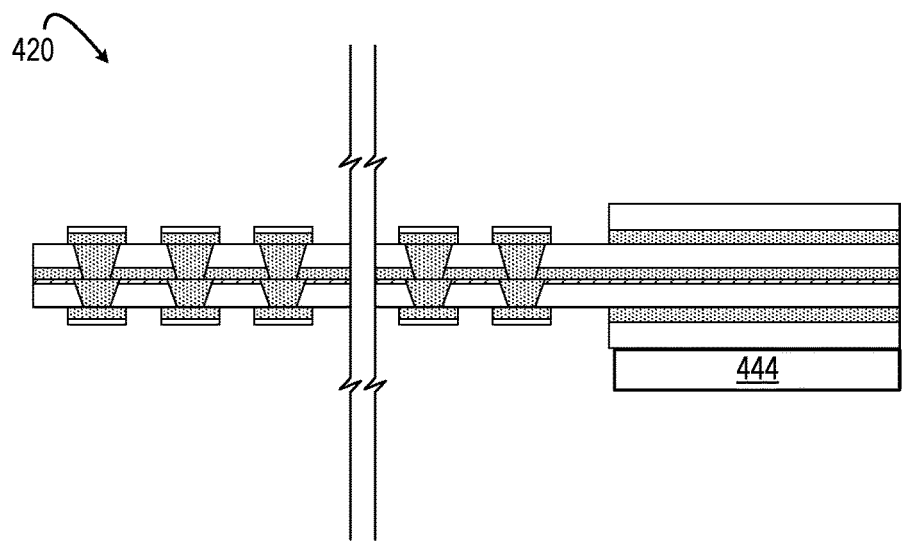
Figure 4F:
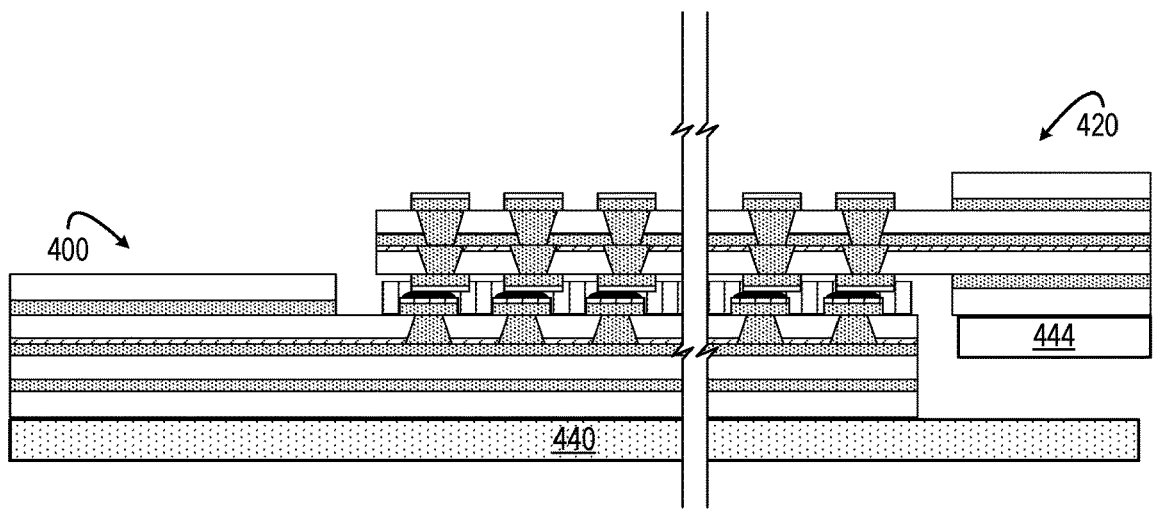
Figure 4G:
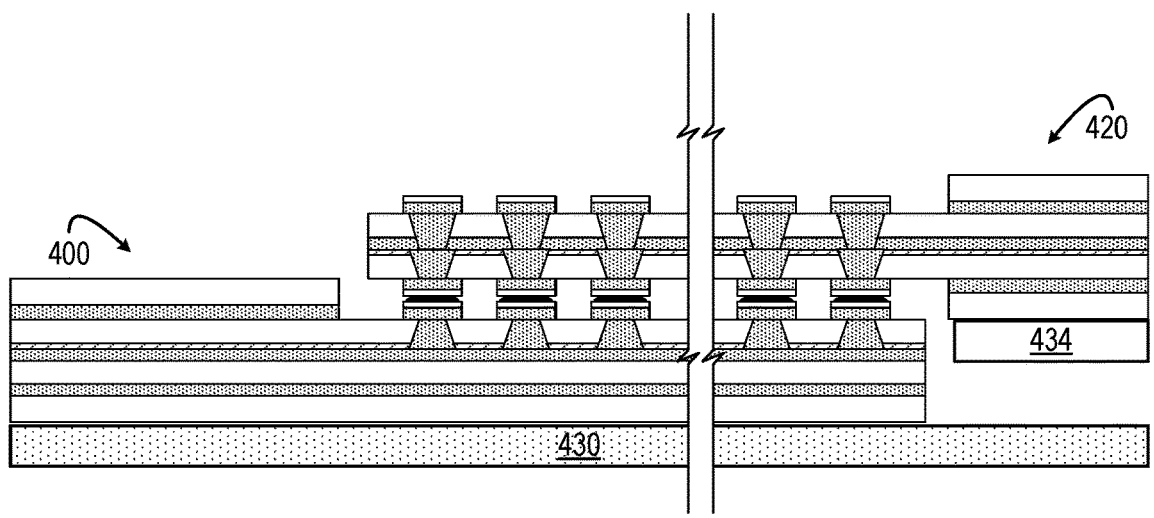

At 306, second printed circuit 420 is mounted onto an alignment carrier 444, as depicted in FIG. 4E. Alignment carrier 444 is configured to move relative to fixture 440 in order to align first and second printed circuits 400, 420. Referring again to FIG. 3, at 308, alignment carrier 444 is mounted to fixture 440, as depicted in FIG. 4F. In some examples, alignment carrier 444 and fixture 440 each may be mounted to a support structure (not shown). Then, at 310 of FIG. 3, the printed circuits are aligned, as shown in FIG. 4G. The printed circuits may be aligned using any suitable method, such as optical alignment or mechanical alignment.

Figure 4H:
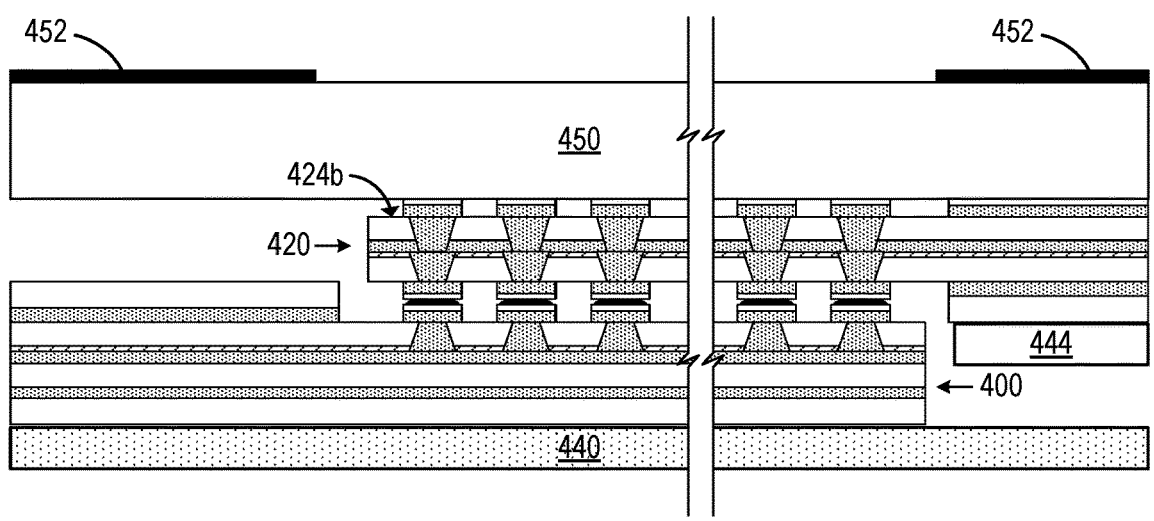

Continuing, at 312 of FIG. 3, a transparent fixture plate 450 is applied to second surface 424b of second printed circuit 420, as depicted in FIG. 4H. Transparent fixture plate 450 may comprise glass or any other suitable material that is suitably transparent to radiant heating wavelengths. In some examples, at 314, a mask 452 is disposed on top of transparent fixture plate 450. Mask 452 may be used to shield parts of printed circuits from radiant heat and may comprise any suitable material that is opaque to radiant heat wavelengths (e.g., aluminum foil or other sheet metal). In other examples, mask 452 may be omitted. Continuing, at 316, the assembly is secured together wherein a clamping force is applied via fixture 440 and transparent fixture plate 450. In some examples, one or more fixture pins may be used to hold transparent fixture plate 450 in place while one or more fixture clamps may be used to apply a clamping force.

Figure 4I:
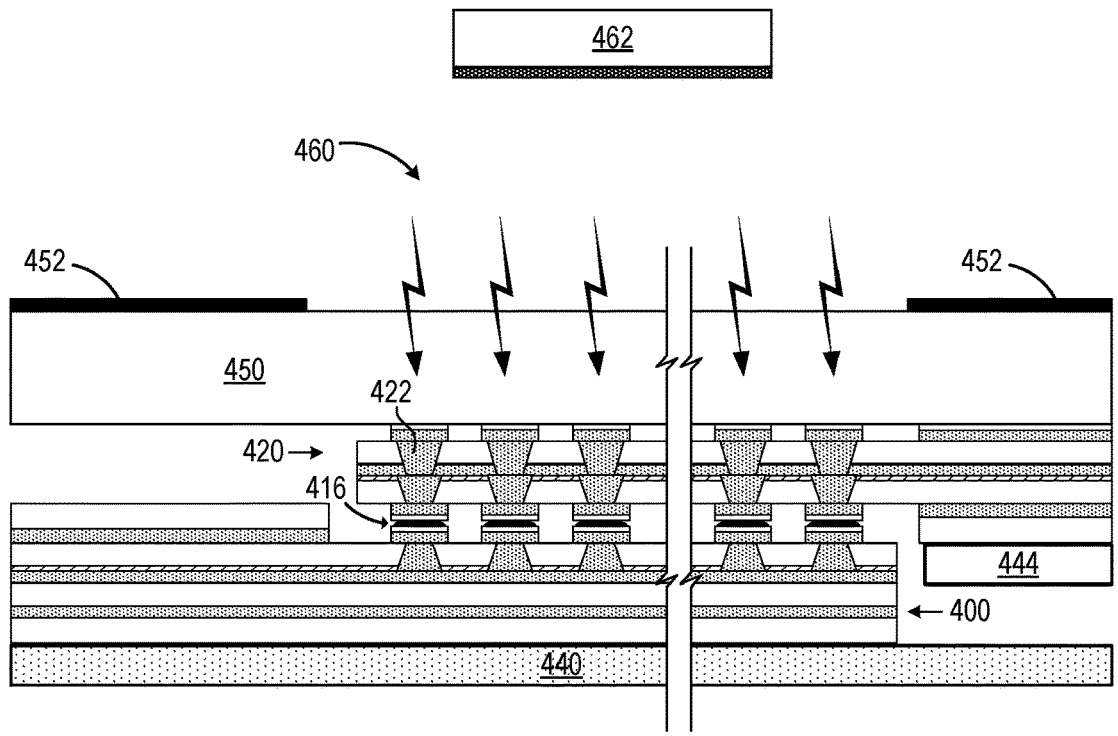

At 318, radiant heat 460 is applied via a light source 462 to second surface 424b of second printed circuit 420, as shown in FIG. 4I. Light source 462 may be configured to emit light in any suitable wavelength range. For example, light source 462 may be an infrared (IR) light source. In some examples, radiant heat 460 may additionally or alternatively comprise visible light. Radiant heat 460 passes through fixture plate 450, which is at least partially transparent to radiant heating wavelengths from light source 462. Radiant heat 460 is incident on vias 422, thereby heating vias 422 via thermal radiation and causing the conductors to conduct heat to solder bumps 416. The exposure time and intensity of radiant heat 460 may be selected to heat the solder to reflow. After heating the solder to reflow, at 320 of FIG. 3, the solder is cooled, thereby forming a plurality of solder joints between contacts 402 and vias 422. In various examples, the solder may be actively or passively cooled.

Figure 4J:
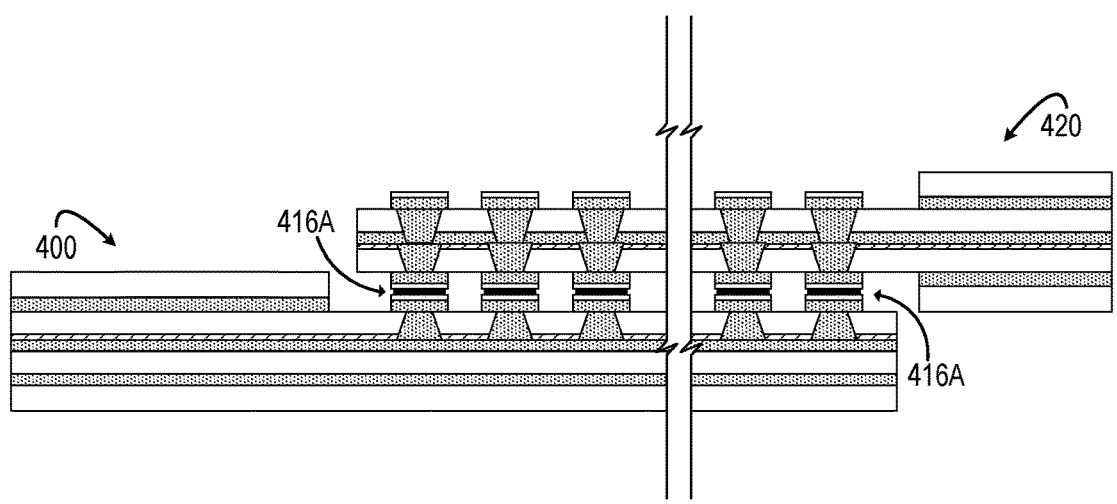

Referring briefly again to FIG. 3, at 322, printed circuits 400, 420 are unmounted and removed from fixture 440, alignment carrier 444, and/or transparent fixture plate 450. FIG. 4J shows the joined circuit structure formed as a result of method 300. The joined circuit structure comprises first printed circuit 400, second printed circuit 420, and a plurality of solder joints 416A formed between contacts 402 and vias 422. In other examples, method 300 can be used to form a single solder joint between a contact of a first printed circuit and a via of a second printed circuit. In further examples, method 300 can be employed for processing multiple printed circuit connections in parallel, each printed circuit connection comprising a first printed circuit, a second printed circuit, and one or more solder connections between the first printed circuit and the second printed circuit. In yet further examples, method 300 may be used to join three or more printed circuits together (e.g. two subsystems to a motherboard) in parallel.

Figure 5:
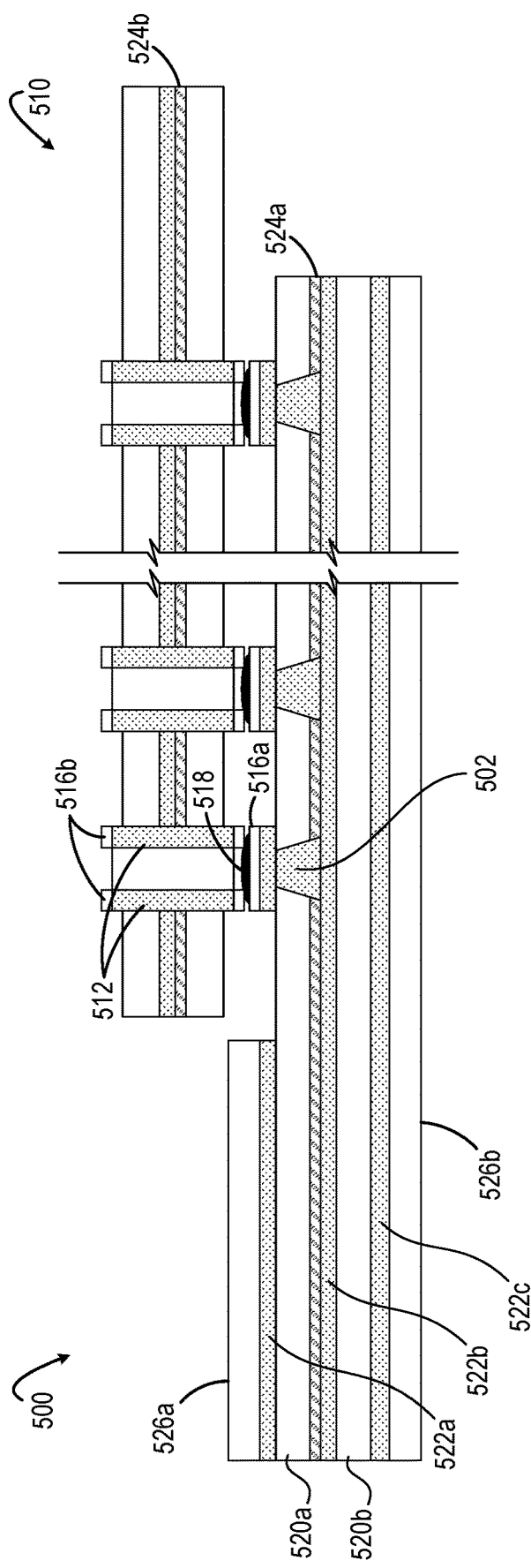
FIG. 5 shows a sectional view of an example connection between two printed circuits comprising through-hole vias and further comprising solder joints formed using radiant heat.

FIG. 5 shows a sectional view of another example printed circuit connection that includes through-hole vias. In this example, a first printed circuit 500 comprises a plurality of contacts, one of which is illustrated as contact 502, exposed on a surface facing a second printed circuit 510. A second printed circuit comprises a corresponding plurality of through-hole vias 512. In this example, each through-hole via 512 comprises a conductive material positioned within and partially filling a through-hole, thereby providing an unfilled path through through-hole via 512. Contacts 502 and through-hole vias 512 may further comprise plating caps 516a, 516b.

Electrical contacts are formed by solder joints, such as solder joint 518 between contact 502 and through-hole via 512. Solder joints 518 may be formed via applying radiant heat according to the examples disclosed herein, e.g., using method 300. As an unfilled path extends through through-hole via 512, the solder that forms solder joints 518 can be heated by radiant heat that impinges directly onto the solder forming solder joint 518.

Similar to the above example, first and second printed circuits 500, 510 further comprise layers of dielectric material 520a, 520b and layers of circuitry 522a, 522b, 522c, e.g., copper or other suitable conductor. Additionally, printed circuits 500, 510 each comprise an adhesive layer 524a, 524b and optionally one or more coverlays 526a, 526b.

As mentioned above, the solder connections of FIGS. 4J and 5 may provide for a relatively thin connection between printed circuits. In some examples, the solder joints are <0.1 mm thick, e.g., the solder joints may comprise a thickness of between 25 μm and 100 μm. A such, the examples disclosed herein may be well-suited for relatively compact, smaller form-factor electronic devices (e.g., electronic devices 100, 200).

Figure 6A:
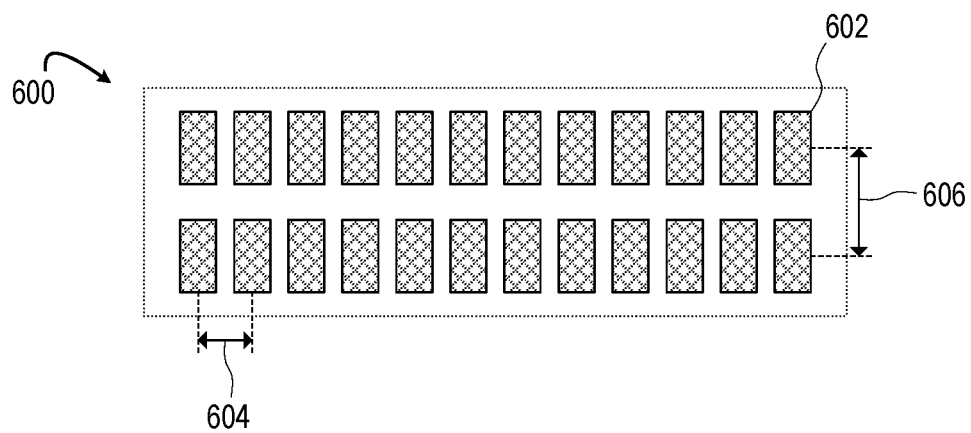
FIG. 6A-6C show example layouts for a two-dimensional pattern of solder joints.
Figure 6B:
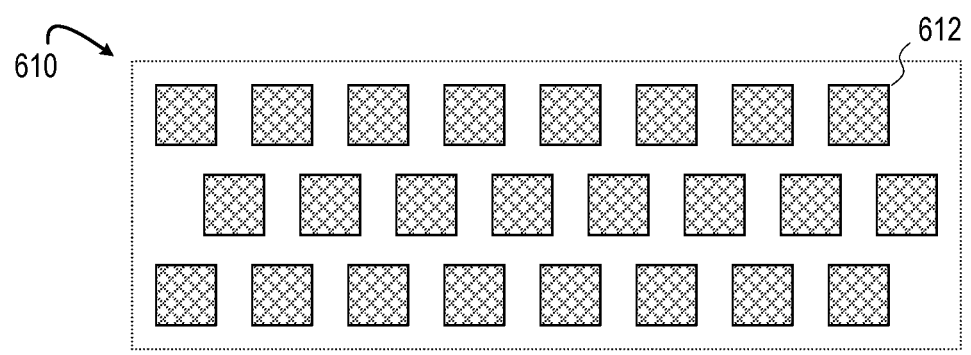
Figure 6C:
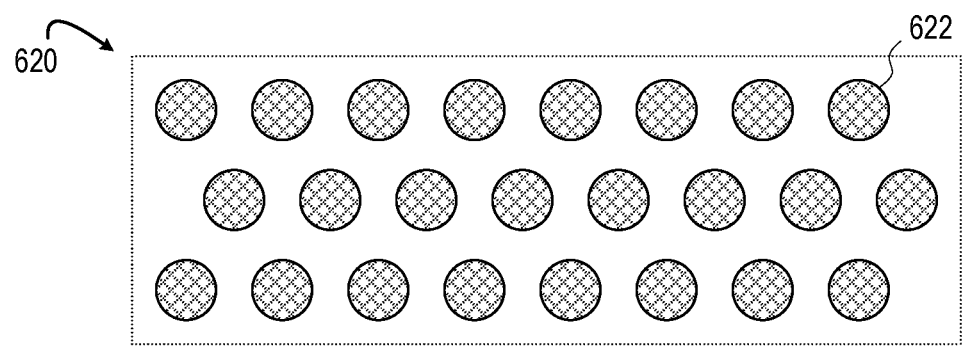

As discussed above, the contacts of the first printed circuit (e.g., first printed circuit 400 or first printed circuit 500) may be arranged in a two-dimensional pattern on the surface of the printed circuit while the vias of a second printed circuit are arranged in a corresponding two-dimensional pattern. FIGS. 6A-6C show three example layouts 600, 610, 620 for a two-dimensional pattern of contacts. The contacts may comprise printed copper or other suitable conductor. Layout 600 of FIG. 6A shows a top view of a two-dimensional pattern comprising two rows of rectangular contacts 602 with pitch 604 and row spacing 606. Layout 610 of FIG. 6B shows 24 square contacts 612 arranged in a two-dimensional pattern comprising three rows. Layout 620 of FIG. 6C shows 24 circular contacts 622 arranged in a two-dimensional pattern comprising three rows. In other examples, any suitable pattern and any suitable shapes (e.g., ellipse) may be used. The examples disclosed herein may allow for forming two or more rows of solder joints in parallel.

The contacts may comprise any suitable size and any suitable pitch. In some examples, the pitch is between 0.5 mm to 1.2 mm. However, in other examples the pitch may comprise lesser or greater values. Also, as shown in layout 600, the row spacing 606 may be different from the pitch 604. A pattern of contacts for soldering according to the present disclosure may comprise any suitable size, pitch, and density of contacts. In some examples, the density of contacts is between 0.5 contacts/mm$^2$ and 4.0 contacts/mm$^2$. Contact size may decrease as contacts are placed closer together. Thus, a relatively smaller contact size may be associated with a relatively smaller pitch. The examples disclosed herein may provide for relatively greater surface density of contacts compared to other soldering techniques.

Figure 7:
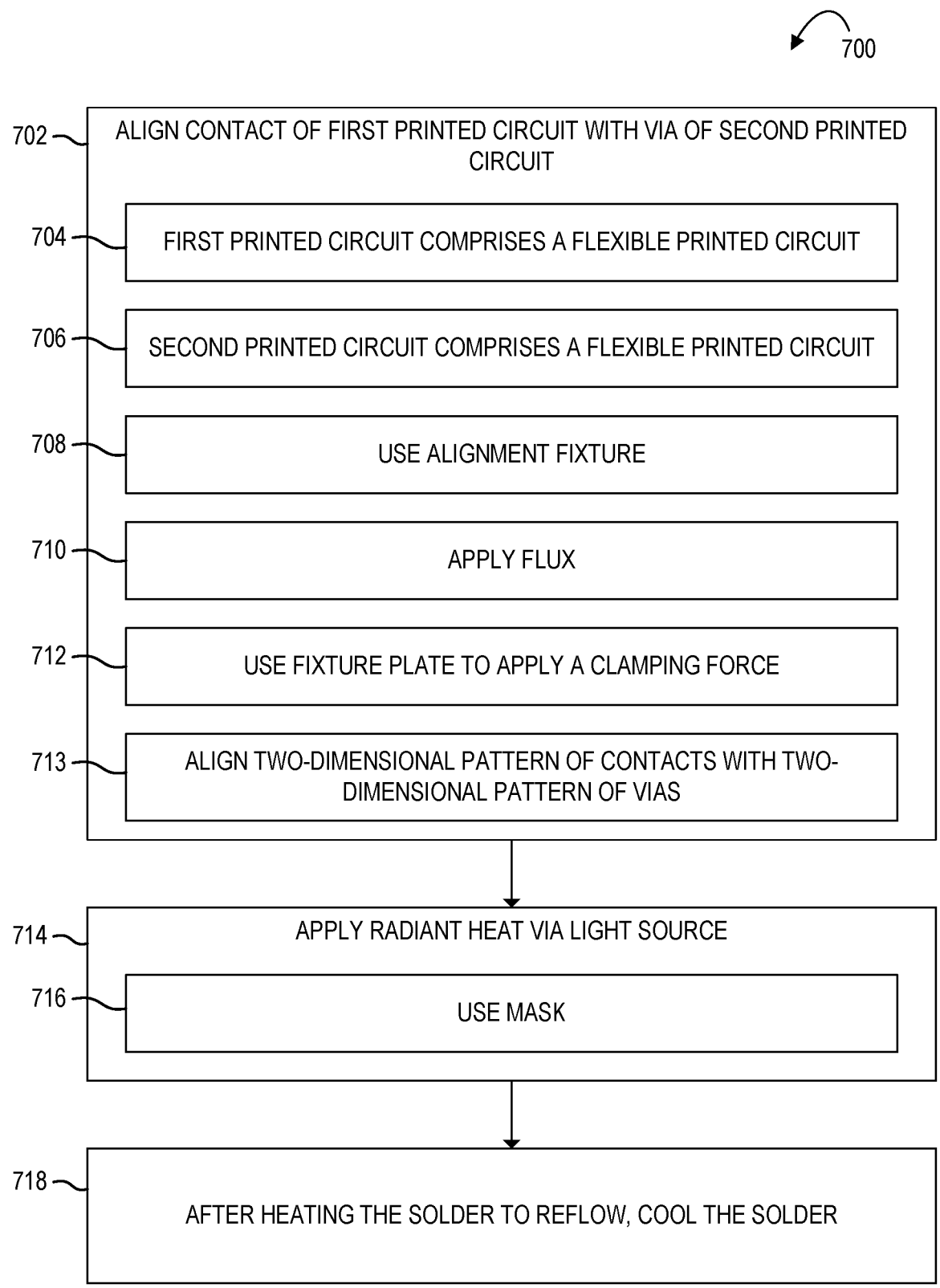
FIG. 7 shows a flow diagram of an example method for manufacturing an electronic device comprising solder joints.

FIG. 7 shows a flow diagram for an example method for manufacturing an electronic device. At 702, the method comprises aligning a contact of a first printed circuit with a via of a second printed circuit, the second printed circuit comprising a first surface facing the first printed circuit and a second surface facing away from the first printed circuit. In some examples, at 704, the first printed circuit comprises a flexible printed circuit. In some examples, at 706, the second printed circuit comprises a flexible printed circuit. In some examples, at 708, an alignment fixture is used to align the printed circuits, e.g., fixture 440 and/or alignment carrier 444. Further, the first printed circuit can be mounted on a fixture plate and the second printed circuit mounted on an alignment carrier which is then mounted to the fixture plate. In some examples, at 710, the method further comprises applying a flux to the contacts of the first printed circuit prior to aligning. In some examples, at 712, an at least partially transparent fixture plate is used to apply a clamping force to the first and second printed circuits. In some examples, at 713, the method comprises aligning a two-dimensional pattern of contacts with a corresponding two-dimensional pattern of vias.

At 714, the method further comprises applying radiant heat via an infrared light source to the second surface of the second printed circuit. The radiant heat is incident on the via to cause the via to conduct heat to solder located at an interface of the contact and the via. In some examples, at 716, a mask is used, which allows radiant heat to be incident on the vias of the second printed circuit while masking radiant heat to some other areas.

At 718, after heating the solder to reflow, method 700 comprises cooling the solder, thereby forming a solder joint between the contact and the via.

In some embodiments, the methods and processes described herein may be tied to a computing system of one or more computing devices. In particular, such methods and processes may be implemented as a computer-application program or service, an application-programming interface (API), a library, and/or other computer-program product.

Another example provides an electronic device comprising a first flexible printed circuit comprising a two-dimensional pattern of contacts on a first surface, a second flexible printed circuit comprising a corresponding two-dimensional pattern of vias, and a plurality of solder joints, each solder joint formed between a contact of the two-dimensional pattern of contacts and a corresponding via of the corresponding two-dimensional pattern of vias. In some such examples, each via of the two-dimensional pattern of vias comprises one or more of a blind via, a buried via, or a through-hole via. In some such examples, the two-dimensional pattern of contacts of the first flexible printed circuit additionally or alternatively comprises a two-dimensional pattern of vias extending at least partially through the first flexible printed circuit. In some such examples, the two-dimensional pattern of contacts additionally or alternatively comprises a two-dimensional pattern of printed conductors. In some such examples, the electronic device additionally or alternatively comprises a plating cap on each via, wherein each solder joint is formed between a plating cap of a via and a corresponding contact. In some such examples, the two-dimensional pattern of contacts additionally or alternatively comprises two or more rows of contacts. In some such examples, the two-dimensional pattern of contacts additionally or alternatively comprises a contact density between 0.5 contacts/mm$^2$ and 4.0 contacts/mm$^2$. In some such examples, the second flexible printed circuit additionally or alternatively comprises a multilayer flexible printed circuit comprising a first layer positioned on a side facing the first flexible printed circuit and a second layer positioned on a side opposite from the first flexible printed circuit, wherein one or more vias of the two-dimensional pattern of vias each comprise a blind via in the first layer, each blind via of the first layer aligned with a corresponding blind via of the second layer.

Another example provides a method of manufacturing an electronic device, the method comprising aligning a contact of a first printed circuit with a via of a second printed circuit, the second printed circuit comprising a first surface facing the first printed circuit and a second surface facing away from the first printed circuit, applying radiant heat via an infrared light source to the second surface of the second printed circuit, the radiant heat incident on the via to cause the via to conduct heat to solder located at an interface of the contact and the via, and after heating the solder to reflow, cooling the solder, thereby forming a solder joint between the contact of the first printed circuit and the via of the second printed circuit. In some such examples, the method further comprises applying a flux between the first printed circuit and the second printed circuit before aligning the contact with the via. In some such examples, aligning the contact and the via additionally or alternatively comprises aligning the first printed circuit and the second printed circuit via an alignment fixture. In some such examples, the fixture additionally or alternatively comprises an at least partially transparent fixture plate to apply a clamping force, the at least partially transparent fixture plate positioned on the second surface of the second printed circuit. In some such examples, one or more of the first printed circuit and second printed circuit additionally or alternatively comprises a flexible printed circuit. In some such examples, the method additionally or alternatively comprises aligning a two-dimensional pattern of contacts of the first printed circuit with a corresponding two-dimensional pattern of vias of the second printed circuit. In some such examples, the via additionally or alternatively comprises a through-hole via, wherein the radiant heat is also incident on solder inside the through-hole via.

Another example provides an electronic device comprising a first printed circuit comprising a contact on a first surface, a second printed circuit, the second printed circuit comprising a multilayer printed circuit comprising a first layer facing the first surface of the first printed circuit and a second layer opposite the first printed circuit, the first layer comprising a first blind via, the second layer comprising a second blind via, the second blind via aligned with the first blind via, and a solder joint formed between the contact of the first printed circuit and the first blind via of the multilayer printed circuit. In some such examples, one or more of the first printed circuit and the multilayer printed circuit comprises a flexible printed circuit. In some such examples, the contact additionally or alternatively comprises a third blind via. In some such examples, the first printed circuit additionally or alternatively comprises a two-dimensional pattern of contacts, and the first layer of the second printed circuit comprises a corresponding two-dimensional pattern of blind vias. In some such examples, the solder joint between the first printed circuit and the second printed circuit additionally or alternatively comprises a thickness of between 25 μm and 100 μm.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic device comprising:
a first flexible printed circuit comprising a two-dimensional pattern of contacts on a first surface, wherein the two-dimensional pattern of contacts comprises a contact density between 0.5 contacts/mm$^2$ and 4.0 contacts/mm$^2$;
a second flexible printed circuit comprising a corresponding two-dimensional pattern of vias; and
a plurality of solder joints, each solder joint formed between a contact of the two-dimensional pattern of contacts and a corresponding via of the corresponding two-dimensional pattern of vias.

2. The electronic device of claim 1, wherein each via of the two-dimensional pattern of vias comprises one or more of a blind via, a buried via, or a through-hole via.

3. The electronic device of claim 1, wherein the two-dimensional pattern of contacts of the first flexible printed circuit comprises a two-dimensional pattern of vias extending at least partially through the first flexible printed circuit.

4. The electronic device of claim 1, wherein the two-dimensional pattern of contacts comprises a two-dimensional pattern of printed conductors.

5. The electronic device of claim 1, further comprising a plating cap on each via, and wherein each solder joint is formed between a plating cap of a via and a corresponding contact.

6. The electronic device of claim 1, wherein the two-dimensional pattern of contacts comprises two or more rows of contacts.

7. The electronic device of claim 1, wherein the second flexible printed circuit comprises a multilayer flexible printed circuit comprising a first layer positioned on a side facing the first flexible printed circuit and a second layer positioned on a side opposite from the first flexible printed circuit; and
wherein one or more vias of the two-dimensional pattern of vias each comprise a blind via in the first layer, each blind via of the first layer aligned with a corresponding blind via of the second layer.

8. An electronic device comprising:
a first printed circuit comprising a two-dimensional pattern of contacts on a first surface, wherein the two-dimensional pattern of contacts comprises a contact density between 0.5 contacts/mm$^2$ and 4.0 contacts/mm$^2$;
a second printed circuit, the second printed circuit comprising a multilayer printed circuit comprising a first layer facing the first surface of the first printed circuit and a second layer opposite the first printed circuit, the first layer comprising a first blind via, the second layer comprising a second blind via, the second blind via aligned with the first blind via; and
a solder joint formed between a first contact of the two-dimensional pattern of contacts of the first printed circuit and the first blind via of the multilayer printed circuit.

9. The electronic device of claim 8, wherein one or more of the first printed circuit and the multilayer printed circuit comprises a flexible printed circuit.

10. The electronic device of claim 8, wherein the first contact of the two-dimensional pattern of contacts comprises a third blind via.

11. The electronic device of claim 8, wherein the first layer of the second printed circuit comprises a corresponding two-dimensional pattern of blind vias.

12. The electronic device of claim 8, wherein the solder joint between the first printed circuit and the second printed circuit comprises a thickness of between 25 μm and 100 μm.

* * * * *